US010132863B2

(12) United States Patent
Hopkins

(10) Patent No.: US 10,132,863 B2
(45) Date of Patent: *Nov. 20, 2018

(54) DEBUG ARCHITECTURE

(71) Applicant: UltraSoC Technologies Ltd., Cambridge (GB)

(72) Inventor: Andrew Brian Thomas Hopkins, Lyminge (GB)

(73) Assignee: ULTRASOC TECHNOLOGIES LTD., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/843,745

(22) Filed: Sep. 2, 2015

(65) Prior Publication Data
US 2015/0377965 A1 Dec. 31, 2015

Related U.S. Application Data

(63) Continuation of application No. 13/938,077, filed on Jul. 9, 2013, now Pat. No. 9,176,552.

(30) Foreign Application Priority Data

Jul. 9, 2012 (GB) .................................. 1212179.4

(51) Int. Cl.
G06F 1/32 (2006.01)
G06F 1/26 (2006.01)
(Continued)

(52) U.S. Cl.
CPC . G01R 31/31705 (2013.01); G01R 31/31721 (2013.01); G06F 1/24 (2013.01);
(Continued)

(58) Field of Classification Search
None
See application file for complete search history.

(56) References Cited

U.S. PATENT DOCUMENTS 5,881,223 A 3/1999 Agrawal et al.
6,338,992 B1 1/2002 Ahmed et al.
(Continued)

FOREIGN PATENT DOCUMENTS

EP 2463780 A1 6/2012
WO 2007104027 A2 9/2007

OTHER PUBLICATIONS

GB 1212179.4—Combined Search and Examination Report dated Aug. 1, 2013, 4 pages.
(Continued)

Primary Examiner — Tanh Q Nguyen
(74) Attorney, Agent, or Firm — Haynes Beffel & Wolfeld LLP

(57) ABSTRACT

Roughly described, a method of powering down a portion of an integrated circuit chip, the portion of the integrated circuit chip comprising a plurality of peripheral circuits, each peripheral circuit being connected to a respective debug unit, the method comprising: prior to power down, extracting from each debug unit configuration information of that debug unit; storing the configuration information of the debug units in a memory on the integrated circuit chip during power down of the portion of the integrated circuit chip; and on power up, restoring the configuration information of each debug unit to that debug unit prior resuming operation of that debug unit and the peripheral circuit connected to that debug unit.

16 Claims, 8 Drawing Sheets

(51) Int. Cl.
  *G06F 1/00*    (2006.01)
  *G06F 9/44*    (2018.01)
  *G01R 31/28*   (2006.01)
  *G01R 31/317*  (2006.01)
  *G06F 1/24*    (2006.01)
  *G06F 1/30*    (2006.01)
  *G06F 11/36*   (2006.01)
  *G06F 11/263*  (2006.01)
  *G06F 11/267*  (2006.01)
  *G06F 15/78*   (2006.01)

(52) U.S. Cl.
  CPC .......... *G06F 1/26* (2013.01); *G06F 1/30* (2013.01); *G06F 1/32* (2013.01); *G06F 1/3203* (2013.01); *G06F 1/325* (2013.01); *G06F 1/3206* (2013.01); *G06F 1/3234* (2013.01); *G06F 1/3246* (2013.01); *G06F 1/3287* (2013.01); *G06F 11/263* (2013.01); *G06F 11/267* (2013.01); *G06F 11/36* (2013.01); *G06F 11/362* (2013.01); *G06F 11/3636* (2013.01); *G06F 11/3648* (2013.01); *G06F 11/3656* (2013.01); *G06F 15/7807* (2013.01)

(56) References Cited

U.S. PATENT DOCUMENTS

| | | |
|---|---|---|
| 8,595,389 B2 | 11/2013 | Davis et al. |
| 9,003,232 B2* | 4/2015 | Hopkins ............... G06F 11/263 714/32 |
| 9,176,552 B2* | 11/2015 | Hopkins ............... G06F 1/3206 |
| 9,218,258 B2* | 12/2015 | Hopkins ............... G06F 11/2205 |
| 2008/0127216 A1 | 5/2008 | Bueti et al. |
| 2009/0271553 A1 | 10/2009 | Gang et al. |
| 2011/0161760 A1 | 6/2011 | Bansal |
| 2011/0283141 A1 | 11/2011 | Lee et al. |
| 2012/0110353 A1 | 5/2012 | Ehrlich et al. |
| 2013/0054845 A1* | 2/2013 | Nimmala ............ G06F 13/4022 710/36 |
| 2013/0159776 A1* | 6/2013 | Gilday ................ G06F 11/3656 714/37 |
| 2014/0013145 A1 | 1/2014 | Hopkins |
| 2015/0377965 A1* | 12/2015 | Hopkins ............... G06F 1/3206 714/724 |

OTHER PUBLICATIONS

U.S. Appl. No. 13/938,077—Office Action dated Nov. 20, 2014, 14 pages.
U.S. Appl. No. 13/938,077—Notice of Allowance dated Jun. 1, 2015, 5 pages.
U.S. Appl. No. 13/938,077—Response to Office Action dated Nov. 20, 2014 filed Feb. 19, 2015, 13 pages.
U.S. Appl. No. 13/938,077—Office Action dated Mar. 5, 2015, 14 pages.
U.S. Appl. No. 13/938,077—Response to Office Action dated Mar. 5, 2015 filed May 18, 2015, 13 pages.
GB 1212179.4—Response to Combined Search and Examination Report dated Aug. 1, 2013 filed Aug. 16, 2013, 61 pages.
GB 1212179.4—Office Action dated Oct. 17, 2013, 2 pages.
GB 1212179.4—Notice of Allowance dated Jun. 3, 2014, 1 page.
U.S. Appl. No. 13/938,077—Preliminary Amendment dated Jul. 10, 2014, 8 pages.

* cited by examiner

DEBUG ARCHITECTURE

CROSS REFERENCE TO OTHER APPLICATIONS

This application is a continuation of U.S. application Ser. No. 13/938,077, filed Jul. 9, 2013, entitled "DEBUG ARCHITECTURE," which claims the benefit of prior United Kingdom Patent Application No. GB 1212179.4, filed Jul. 9, 2012, entitled "DEBUG ARCHITECTURE," both of which applications are incorporated herein by reference in their entirety.

BACKGROUND

This disclosure relates to debugging peripheral circuits, such as processors, on an integrated circuit chip. The disclosure is particularly relevant to debugging peripheral circuits which form part of a System-on-Chip (SoC).

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for debugging the core devices, because debugging tools such as oscilloscopes and logic analyzers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of debugging tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external debugging tools to find and solve bugs within the system in the timescales demanded by the industry.

Thus, the development of SoC devices required associated development in debugging technology, which lead to the integration of some debug functionality onto the SoC. It is now customary for each core device to have an associated debug unit. Typically, the debug unit can manipulate the operation of the core device (e.g. start/stop the core device), and also collect trace data from that core device. The collected debug information is then funnelled off chip via a debug port to external debugging tools. Whilst these developments have improved debugging of SoC devices, that debugging is generally limited to independent monitoring and assessment of the individual cores. This is typically because different manufacturers supply the core devices which a SoC manufacturer then embeds onto the SoC. Each manufacturer supplies its core device with an associated debug unit, which is configured to communicate with external debugging tools to debug that core device. For a multiple core SoC, the total cost in terms of silicon area for provision of debug units and debug ports for each core device is undesirably high. Additionally, even with such a debug architecture in place, complete system-level debug is still not achievable.

Thus, there is a need for an improved debug architecture for debugging SoC devices.

SUMMARY

According to a first aspect of the disclosure, there is provided a method of powering down a portion of an integrated circuit chip, the portion of the integrated circuit chip comprising a plurality of peripheral circuits, each peripheral circuit being connected to a respective debug unit, the method comprising: prior to power down, extracting from each debug unit configuration information of that debug unit; storing the configuration information of the debug units in a memory on the integrated circuit chip during power down of the portion of the integrated circuit chip; and on power up, restoring the configuration information of each debug unit to that debug unit prior resuming operation of that debug unit and the peripheral circuit connected to that debug unit.

Suitably, for each debug unit, the configuration information is sent from that debug unit in an extraction message set comprising one or more messages and is restored to that debug unit in a restoration message set comprising one or more messages, the extraction message set matching the restoration message set.

Suitably, the configuration information in the extraction message set is ordered such that on receipt of the restoration message set, the debug unit is restored to the configuration it had prior to power down.

Suitably, the memory is at a location on the integrated circuit chip that is powered up during power down of the portion of the integrated circuit chip.

Suitably, the memory is integrated in a shared hub, the shared hub being accessible by the debug units.

Suitably, the method further comprises prior to extracting from each debug unit configuration information of that debug unit, sending a power down handshake message from a power controller to each debug unit.

Suitably, the method further comprises, on receipt of the power down handshake message at a debug unit, sending a message to initialise the memory from that debug unit to the memory.

Suitably, the method further comprises prior to restoring the configuration information of each debug unit, sending a power up handshake message from a power controller to each debug unit.

Suitably, a first shared hub is directly accessible by a first debug unit and a second debug unit, and a second shared hub is directly accessible by the first shared hub, and the method further comprises: routing extracted configuration information from the first debug unit and the second debug unit to the first shared hub; routing extracted configuration information from the first shared hub and the extracted configuration information from the first debug unit and the second debug unit to the second shared hub; and storing the extracted configuration information from the first shared hub, first debug unit and second debug unit in the memory located in the second shared hub.

Suitably, the peripheral circuits and debug units form part of a hierarchical debug architecture on the integrated circuit chip, each layer of the hierarchical debug architecture comprising at least one shared hub directly accessible by at least one structure on another layer of the hierarchical debug architecture, wherein the method further comprises: prior to power down, at each shared hub, determining the number of structures accessible by that shared hub in higher layers of the hierarchical debug architecture that have configuration information to be extracted prior to power down; adding the number of structures at that shared hub to the determined number to form an accumulated number; and routing the accumulated number to a shared hub on a lower layer of the hierarchical debug architecture.

Suitably, the peripheral circuits and debug units form part of a hierarchical debug architecture on the integrated circuit chip, each layer of the hierarchical debug architecture comprising at least one shared hub directly accessible by at least one structure on another layer of the hierarchical debug architecture, wherein the method further comprises prior to power down, at each shared hub, determining the size of configuration data of structures accessible by that shared hub in higher layers of the hierarchical debug architecture that is to be extracted prior to power down; adding the size of configuration data of that shared hub to the determined size to form an accumulated size, and routing that accumulated size to a shared hub on a lower layer of the hierarchical debug architecture.

Suitably, power down occurs whilst the integrated circuit chip is being debugged.

Suitably, the debug units comprise hardware.

Suitably, the configuration information comprises state information.

According to a second aspect of the disclosure, there is provided an integrated circuit chip comprising: a portion of the integrated circuit chip comprising a plurality of peripheral circuits, each peripheral circuit connected to a respective debug unit; and a memory for storing configuration information of the debug units; wherein each debug unit is configured to send its configuration information to the memory prior to powering down the portion of the integrated circuit chip; wherein the memory is configured to store the configuration information of the debug units during power down of the portion of the integrated circuit chip; and wherein the integrated circuit chip is configured to restore the configuration information of that debug unit to that debug unit on power up prior to resuming operation of that debug unit and the peripheral circuit connected to that debug unit.

Suitably, the integrated circuit chip further comprises a power controller configured to send a power down handshake message to each debug unit prior to the extraction of configuration information from each debug unit.

Suitably, a debug unit is configured to send a message to initialise the memory on receipt of the power down handshake message.

Suitably, the integrated circuit chip further comprises a power controller configured to send a power up handshake message from a power controller to each debug unit prior to restoring the configuration information of each debug unit.

Suitably, a first shared hub is directly accessible by a first debug unit and a second debug unit, and a second shared hub is directly accessible by the first shared hub, wherein: the first debug unit is configured to route extracted configuration information from that first debug unit to the first shared hub; the second debug unit is configured to route extracted configuration information from that second debug unit to the first shared hub; the first shared hub is configured to route extracted configuration information from the first shared hub and the extracted configuration information from the first debug unit and the second debug unit to the second shared hub; and the memory is located in the second shared hub and is configured to store the extracted configuration information from the first shared hub, first debug unit and second debug unit.

BRIEF DESCRIPTION OF THE DRAWINGS

The present disclosure will now be described by way of example with reference to the accompanying drawings. In the drawings.

DETAILED DESCRIPTION

The following disclosure describes a debug architecture suitable for implementation on a SoC. The debug architecture enables debugging of the whole SoC rather than just individual core devices.

FIGS. 1, 2, 3, 7, 8 and 9 are schematic diagrams of exemplary debug architectures, and components within debug architectures. These figures present the structures in terms of functional blocks. Some functional blocks for carrying out functions well known in the art have in places been omitted from these figures.

Figure 1:
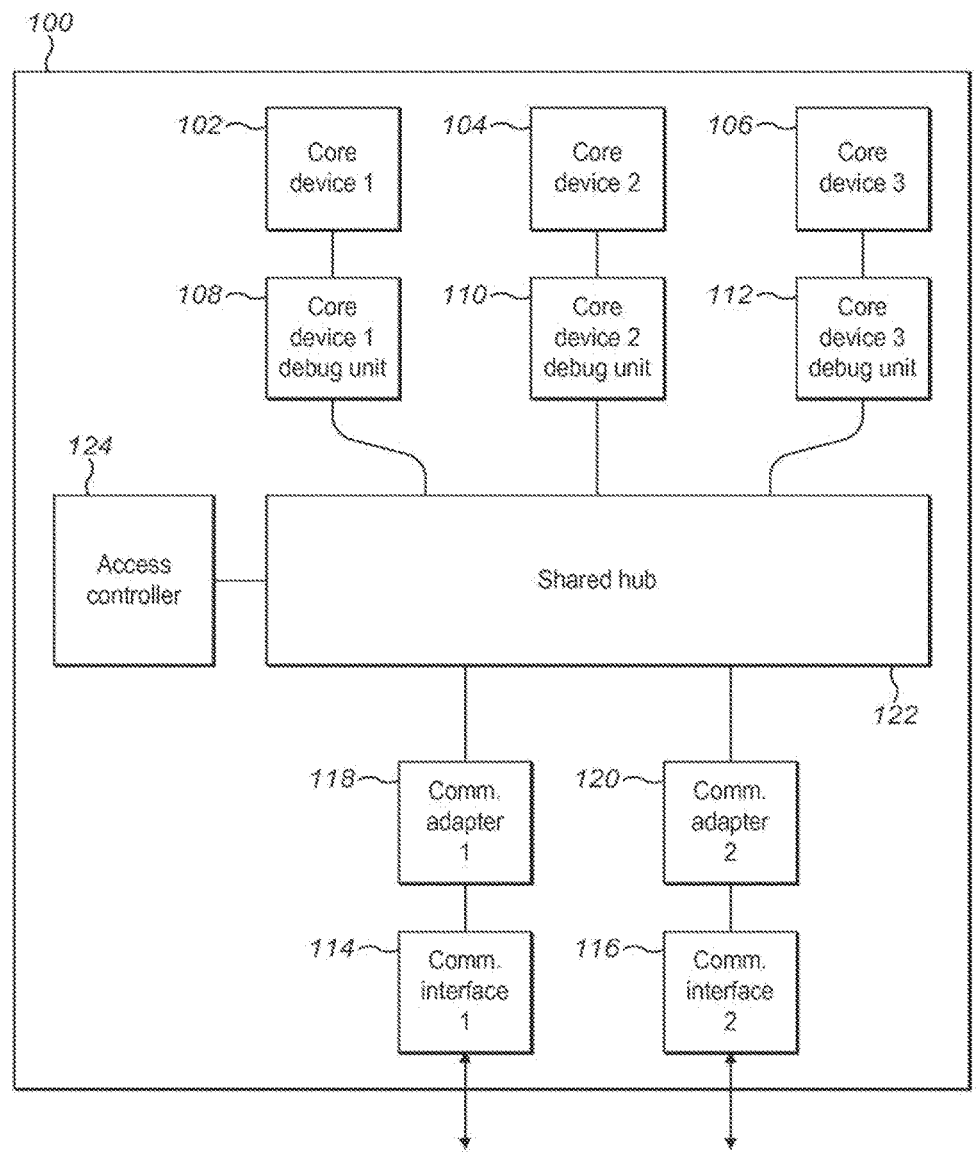
FIG. 1 is a schematic diagram of an exemplary debug architecture.

FIG. 1 illustrates the general structure of an exemplary debug architecture for a SoC 100. Core devices 102, 104 and 106 of the SoC are each respectively connected to their own debug units 108, 110 and 112. Although FIG. 1 illustrates three core devices, any number of core devices can be suitably integrated into the debug architecture. Exemplary core devices include a DSP (digital signal processor), video processor, applications processor graphics processor, system memory, bus, system interconnect, RTOS (real-time operating system), software, data, custom circuit and a data engine. However, any component of a SoC is suitable for being incorporated into the debug architecture as a core device on FIG. 1. The core devices may be emulators or simulators of other devices on the chip. For example, a core device may emulate a processor. The debug unit associated with a core device interfaces that core device.

Communication interfaces at the exterior of the SoC 114, 116 communicate with entities off-chip. Each of the communication interfaces is respectively connected to its own communication adapter 118, 120. Each communication adapter adapts the signals that it receives to a format that is suitable for the communication interface that it is connected to. Although FIG. 1 illustrates two communication interfaces, any number of communication interfaces can be suitably integrated onto the SoC. The communication interfaces implemented are chosen in dependence on the type of connections that are to be made between the SoC and external entities. Exemplary communication interfaces include: traditional debug interfaces such as JTAG, parallel trace input/output, and Aurora based high-speed serial interface; and reuse of system interfaces such as USB, Ethernet, RS232, PCIe and CAN.

An access controller 124 is incorporated into the debug architecture. The access controller controls access to the debug architecture by entities external to the SoC.

The shared hub 122 is central to the debug architecture and is connected to each debug unit, each communication adapter and the access controller. The shared hub has two main functions. Firstly, it comprises resources which are shared between the debug units, for example a shared buffer. By locating such resources in the shared hub as opposed to in the debug units, the debug units are made smaller and hence can be more easily integrated across the chip. Secondly, the shared hub routes signals between the devices on the chip. For example, the shared hub routes messages between the debug units. The shared hub also routes messages between the communication adapters and the debug units. The shared hub also routes messages between the access controller and the communication adapters.

Figure 2:
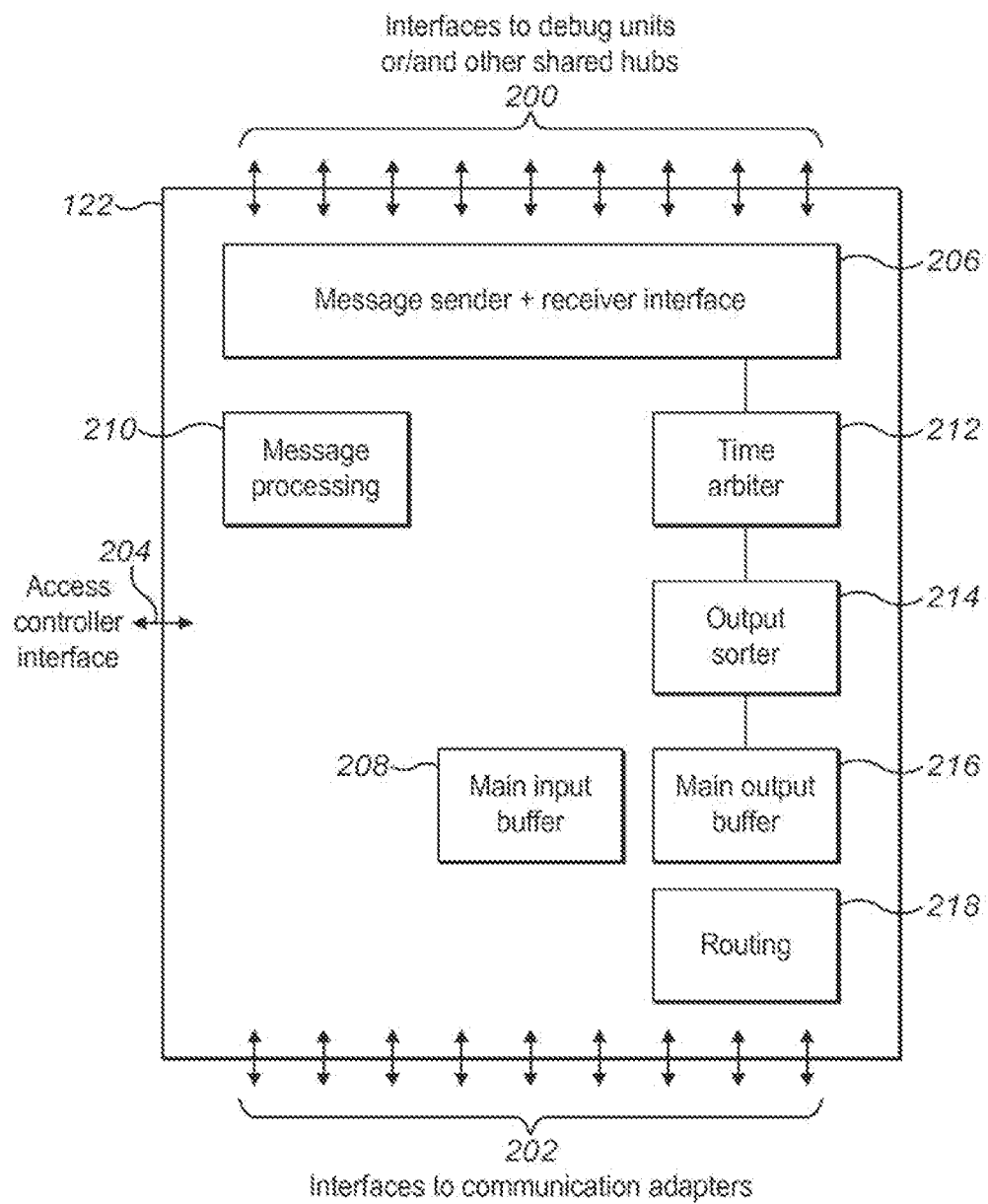
FIG. 2 is a schematic diagram of an exemplary shared hub.

FIG. 2 illustrates an exemplary shared hub 122. The shared hub 122 has a plurality of interfaces 200 for interfacing the debug units and/or other shared hubs. Arrangements in which the debug architecture comprises more than one shared hub are explained in the section entitled Hierarchical Debug Architecture. The shared hub 122 has another plurality of interfaces 202 for interfacing the communication adapters. Finally, the shared hub has an interface 204 for interfacing the access controller. Preferably, the components of the debug architecture communicate only using messages. The shared hub may receive messages from the debug units, other shared hubs, communication adapters or access controller at message sender and receiver interface 206. A message received by the message sender and receiver interface 206 is either a message to be routed onto another entity, or is a message comprising data to be stored in the shared hub. Data to be stored is stored in main input buffer 208. Suitably, messages received by the shared hub to be routed onto another entity are processed by message processing module 210 to modify the destination address as described later in the section entitled Hierarchical Debug Architecture. Typically, the shared hub receives several messages over a very short time period from several different sources, for example the shared hub may receive trace data from several debug units. Suitably, the debug units time stamp the messages that they send to the shared hub. The shared hub determines the time order of these messages at time arbitrator 212, and reorders the messages into time order at output sorter 214. Following buffering at main output buffer 216, the shared hub then routes 218 the messages on towards their destination. For example, in the case that the shared hub receives trace data from several debug units, the shared hub may output the trace data in time sorted order to a communication adapter for communication to an off-chip debugger.

The debug architecture comprises debug units which are suitable for debugging the peripheral circuits to which they are attached thereby generating debug information which is then streamed to the shared hub. The internal structure of the debug units may differ depending on, for example, whether they are configured to passively or actively observe the attached peripheral circuit. A debug unit which passively observes an attached peripheral circuit is limited to analysing the output of that peripheral circuit. Conversely, a debug unit which actively observes an attached peripheral circuit may analyse the output of the peripheral circuit, and additionally may control the peripheral circuit to modify its operation. For example, the debug unit may control the peripheral circuit to slow down the speed at which the peripheral circuit operates or to stop the processor in order to read register values and then start the processor again.

Figure 3:
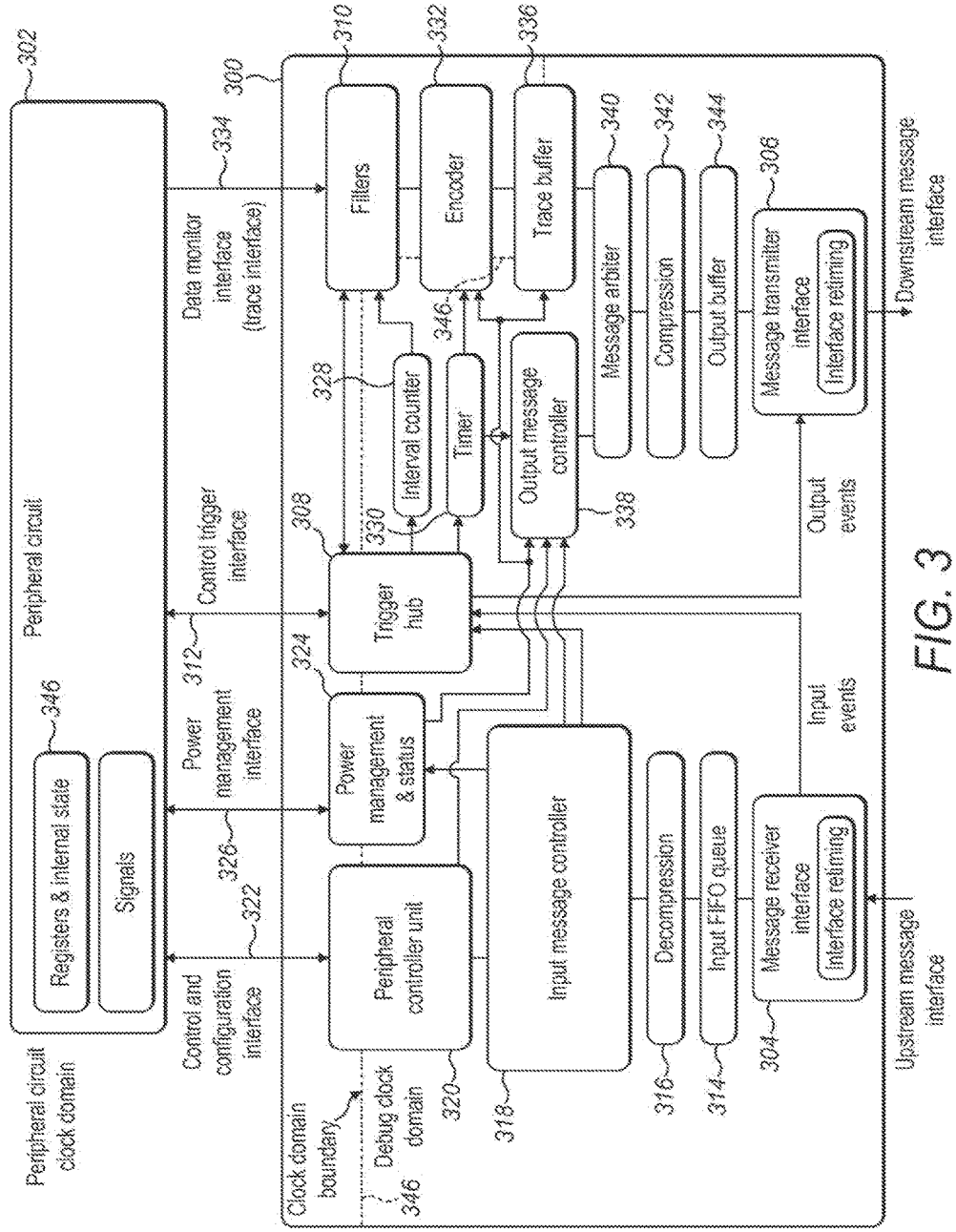
FIG. 3 is a schematic diagram of an exemplary debug unit and attached peripheral circuit.

FIG. 3 illustrates an exemplary active debug unit 300 and attached peripheral circuit 302. The peripheral circuit operates at a higher frequency than most of the debugging architecture. For example, the peripheral circuit may operate at ~1 GHz, whereas the debugging architecture typically operates at ~300 MHz. The debug unit 300 interfaces between the two operating frequencies, and hence partially operates at the peripheral circuit frequency and partially operates at the debugging frequency. These different frequencies are referred to on FIG. 3 as the peripheral circuit clock domain and the debug clock domain. The boundary between the peripheral circuit clock domain and the debug clock domain is illustrated by dashed line 346. FIG. 3 illustrates that the peripheral circuit and the interfaces between the debug unit and the peripheral circuit all operate in the peripheral circuit clock domain. The filters, encoder, trace buffer, peripheral controller unit, power management and status module and trigger hub all operate on the clock domain boundary and hence perform synchronisation between the clocking frequencies. The rest of the debug unit operates in the debug clock domain.

The debug unit 300 receives messages from the shared hub at message receiver interface 304 and sends messages via message transmitter interface 306 to the shared hub. Suitably, messages are retimed on being received by message receiver interface 304 and on being sent by message transmitter interface 306. The messages received by the debug unit are either (i) control messages to control the operation of the debug unit or peripheral circuit, or (ii) event messages to trigger the debug unit or peripheral circuit to operate in a particular way as a result of an event occurring elsewhere in the debug architecture. The messages sent by the debug unit are either (i) control messages to control the operation of other entities in the debug architecture, (ii) event messages to trigger other debug units to operate in a particular way as a result of an event occurring at the debug unit, or (iii) trace data. Trace data is the output of the peripheral circuit which the debug unit has recorded passively whilst the peripheral circuit continues executing.

Event messages are time-critical, and hence if an event message is received by the message receiver interface 304 it is passed directly to the trigger hub 308. If the event message instructs the debug unit to alter the debug data that is being collected by the debug unit, then the trigger hub triggers a reconfiguration of the filters 310 in order to comply with the event message instruction. For example, in the case that the event message instructs the debug unit to search for a particular condition in the output of the peripheral circuit, the trigger hub triggers the match filters to reconfigure to search for that particular condition in the output of the peripheral circuit, and to inform the shared hub of a match if found. If the event message instructs the debug unit to alter the operation of the peripheral circuit, then the trigger hub instructs the peripheral circuit accordingly over control trigger interface 312. For example, the event message may instruct the debug unit to stop the peripheral circuit. Further examples of event messages are ones to initiate the analysis of data from the peripheral circuit, to stop the analysis of data from the peripheral circuit, to release buffered trace data from the debug unit's trace buffer 336, and to re-initiate operation of the peripheral circuit.

Control messages are not time-critical. Control messages received by the message receiver interface 304 are optionally routed through an input FIFO (first-in-first-out) queue 314. The control messages are decompressed 316 and then passed to an input message controller 318. Input message controller 318 performs message parsing and internal routing of the control information to other entities in the debug unit. If the control message is to control the operation of the peripheral circuit, then that control instruction is passed by the input message controller 318 to the peripheral controller unit 320 which instructs the peripheral accordingly over control and configuration interface 322. If the control message is to change the power mode or determine the status of the power mode of the peripheral circuit, then that control instruction is passed by the input message controller 318 to power management and status block 324 which instructs the peripheral accordingly over power management interface 326. If the control message is to control the configuration of the debug unit, then the input message controller 318 passes the control instruction to trigger hub 308 which sends a trigger to the appropriate entity in the debug unit to change its configuration. For example, if the control message instructs the debug unit to change the range of values for which it is recording trace data, then the trigger hub instructs the filters 310 to make this change. If the control message instructs the debug unit to change the interval at which data from the peripheral circuit is sampled, then the trigger hub instructs the interval counter 328 to make this change. The interval counter then triggers the filters to sample the data from the peripheral circuit at the modified sample rate. If the control message instructs the debug unit to recalibrate the timing of the timer 330, then the trigger hub instructs the timer 330 to make this change.

The filters 310 are configured to perform an action in accordance with the interval counter. For example, the filters may sample the data output from the peripheral circuit when the interval counter clocks. As another example, the filters may output data to the encoder 332 when the interval counter clocks. As another example, the filters may only capture data in between one clocking of the interval counter and the next. The filters receive data from the peripheral circuit over the data monitor interface 334. The filters can be set up in several different modes. In a first mode, the filters act as a comparator, for example they only output data if it lies within a certain numerical range. In a second mode, the filters act as a matching filter in that they search for a particular sequence of data. On finding that sequence of data, the filters may send an alert to the trigger hub 308. The trigger hub may create an event message which it outputs to the message transmitter interface 306. The message transmitter interface 306 then passes this event message onto the shared hub. Alternatively, the debug unit may be configured to alter its own configuration when the filter detects the sequence of data. For example, the debug unit may be configured to sample the data output from the peripheral circuit at a higher frequency rate on detecting the sequence of data.

The filters 310 pass the debug data onto the encoder 332. The encoder reformats the data into data messages. The encoder may also analyse the data and apply performance counters. The encoder time stamps the messages it creates using the time from timer 330. The encoder 332 outputs trace data messages to trace buffer 336. The power mode of the encoder and of the trace buffer is controllable by power management block 324. The trace buffer 335 buffers trace data.

Control messages to be output from the debug unit are generated by output message controller 338. An instruction to be incorporated into a control message is received by the output message controller 338 from the input message controller, the peripheral controller unit or the power management module. The output message controller time stamps each message that it creates using the time from timer 330.

Message arbiter 340 selects a message to output from the debug unit, the message selected from the control messages at the output message controller and the trace messages at the trace buffer. The selected message is compressed 342. The output message may then be buffered at output buffer 344. The message is then transmitted to the shared hub by message transmitter interface 306.

The peripheral circuit 302 comprises registers and internal state 346 which may be accessible by the debug unit. For example, the peripheral controller unit 320 may be configured to read register values and/or record the current state of the peripheral circuit.

Message-Based Architecture

As described above, there are three main types of data which are communicated in a debug system: control data, event data (i.e. triggers) and debug data. The debug data is data generated by a debug unit as a result of debugging the peripheral circuit (i.e. core device, for example a processor) connected to that debug unit. An example of debug data is trace data.

These three types of data do not have equal importance. In particular, the successful transport of control data through the debug architecture is more important than the successful transport of other data. Control data may be referred to as integrity critical data or required data. The quality of service of the control data is high. The transport of the control data is to be guaranteed. Conversely, the successful transport of debug data through the debug architecture is not as important. The transport of debug data is done on a best-efforts basis. The quality of service of the debug data is lower than that of the control data.

Because of the need to guarantee the transport of control data, prior systems use separate interfaces for transporting control data and trace data. For example, a JTAG port and associated interface is used to transport all the control data, and the trace data is transported on a separate output-only dedicated interface.

As described above, preferably, the components of the debug architecture communicate only using messages. Suitably, the architecture has only one single physical interface between each pair of components in the architecture. In other words there is only one single physical interface between the shared hub and a debug unit. There is only one single physical interface between the shared hub and a communication adapter. Each interface is configured to transport any message, whether that message comprises control data, event data or debug data. The interface transports the messages over a plurality of flows. The flows are assigned different relative properties. Each message identifies the flow that it is transported on. The flow associated with a message may be used to determine whether to transport the message, and when to transport the message. The flow may also be used by the entity receiving the message to decide whether to store the content of the message, discard the message, or route the message onto another entity.

Figure 4:
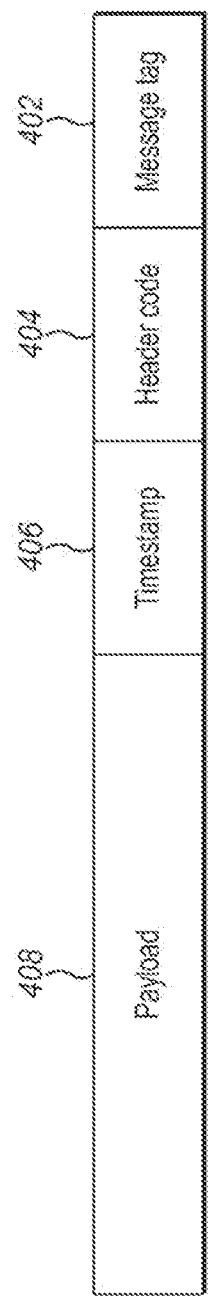
FIG. 4 illustrates a generic message format.

FIG. 4 illustrates a suitable generic format for the messages. The message tag 402 comprises a length value and a flow identifier. The length value specifies the length of the message payload. The flow identifier specifies the flow on which the message is to be transported. Suitably there are four flows. However, there may be any suitable number of flows. The header code 404 identifies the message and its destination address. The time stamp 406 specifies a time and is applied by the unit which initially created the message.

The time stamp is used to facilitate ordering of messages received at the shared hub. The time stamp may, for example, be the absolute time value since: (i) the last reset of the debug unit, (ii) the last reset of the debug architecture, (iii) the last reset of the SoC, or (iv) an event occurred. The payload 408 contains the payload information to be transported to the destination unit.

Flow Priority and Routing

Suitably, different relative priorities are assigned to the different flows. For example, in an architecture comprising four flows, flow 1 is assigned priority 1, flow 2 is assigned priority 2, flow 3 is assigned priority 3, and flow 4 is assigned priority 4. Priority 1 is higher than priority 2. Priority 2 is higher than priority 3. Priority 3 is higher than priority 4. Suitably, if at any time the amount of data to be transported over an interface exceeds the bandwidth of that interface, then data on a flow having a higher priority than another flow is transported in preference to data on that other flow. By segregating the type of data that is transported on the different flows, different relative quality of services for the different types of data is achieved. In an exemplary case, control data is assigned to flow 1, and debug data is assigned to flow 2. Flow 1 has a higher priority than flow 2. Thus, if there is any restriction on the amount of data which can be transported over the interface, the control data on flow 1 is transported in preference to the debug data on flow 2. This enables transport of the control data to be guaranteed whilst enabling transport of the debug data to be on a best-efforts basis. This enables a single interface to transport both control data and debug data whilst still guaranteeing the transport of the control data.

Suitably, the flow identifier of a message is used by the entity receiving the message to determine what action to take in respect of that message. For example, the shared hub may comprise a physical buffer including a plurality of logical buffers. The shared hub may store data from messages on different flows in different ones of the logical buffers. For example, on receiving a message having a flow 1 identifier, the shared hub stores the data in the payload of the message in logical buffer 1, whereas on receiving a message having a flow 2 identifier, the shared hub stores the data in the payload of the message in logical buffer 2.

In another example, the shared hub determines whether to store the data in a message in dependence on the flow identifier of that message. For example, the shared hub stores data from a flow having a higher priority in preference to data from a flow having a lower priority. Suitably, the shared hub only stores data from a higher priority flow in preference to data from a lower priority flow when the shared hub's buffer is reaching capacity.

In a further example, the shared hub discards data from its buffer in order to store further data in the buffer, the discarded data being from a lower priority flow than the further data. Suitably, the shared hub only discards lower priority data in order to store higher priority data when the shared hub's buffer is reaching capacity.

Flows can be used to segregate the data messages in many different ways. For example, data output from different debug units may be transported on different flows. In this case, the internal state of a debug unit is set such that it outputs on a certain flow. Alternatively, or in addition, data to be sent to different debuggers may be transported on different flows. Preferably, debuggers are off-chip debugging tools which communicate with the integrated circuit chip via the communication interfaces. The off-chip debuggers are able to concurrently access the debug units on-chip by utilising the different flows. There is no need for the off-chip debuggers to be time-synchronised. Data can be asynchronously routed to two different debuggers utilising the different flows.

In a further example, specific types of debug data may be assigned to specific flows. For example, a debug unit may be configured to search for condition A and condition B in the output of the peripheral circuit to which that debug unit is connected. The debug unit's state may be configured such that when the debug unit's filters detect a match for condition A, the debug unit outputs trace data on flow 1, whereas when the debug unit's filters detect a match for condition B, the debug unit outputs trace data on flow 2.

Throttling

Suitably, throttling is applied when needed to reduce the amount of debug data, for example trace data, being generated by the debug units. Suitably, a throttle level is received at a debug unit as an event or trigger. That throttle level indicates to the debug unit an action to take to reduce the amount of debug data that that debug unit is generating. The debug unit changes its configuration as indicated by the throttle level in order to reduce the amount of debug data that it generates.

In an example, the throttle level indicates to the debug unit a set of filtering conditions to search for. The debug unit compares the set of filtering conditions to its current filtering conditions, and modifies the current filtering conditions to match the new set of filtering conditions. For example, the current filtering conditions may be to trace data in data ranges 10-200 and 500-1000. Whereas, the new filtering conditions may be to trace data in data ranges 50-100 and 600-800. As another example, the throttle level may indicate to the debug unit to stop tracing and to search for a certain event. On detecting that event, the debug unit initiates tracing again. As another example, the throttle level may indicate to the debug unit to sample data from the connected peripheral circuit at a lower sampling rate. This is implemented at the debug unit by increasing the time intervals between clocking the interval counter 328 on FIG. 3.

In another example, the throttle level indicates to the debug unit a command to pass on to the peripheral circuit connected to the debug unit. For example, the throttle level may indicate to the debug unit to slow down the operating speed of the peripheral circuit. Suitably, the debug unit sends this command to the peripheral circuit over control and configuration interface 322 of FIG. 3. This results in less trace data being generated. This is beneficial in that all the activity of the peripheral circuit can continue to be captured whilst reducing the rate at which trace data is generated. However, it is intrusive on the operation of the peripheral circuit.

Typically, throttling is instigated by the shared hub. Suitably, the buffer in the shared hub is used to store trace data generated by the debug units. If that buffer starts to reach capacity, the shared hub generates a throttling trigger in order to prevent the buffer from overloading. The throttling trigger may instruct the debug units connected to that shared hub to stop tracing altogether. However, it is more preferable, for the throttling trigger to reduce but not stop the amount of trace data being generated by the debug units as described in the examples above. If, despite the throttling, the shared hub's buffer reaches capacity, the buffer may discard trace data currently stored in the buffer which has a low priority in order to store higher priority trace data that is being received from a more important peripheral circuit.

Throttling may be instigated by a device external to the integrated circuit chip, for example an off-chip debugger. The rate at which data is transported over the communication interfaces of FIG. 1 is lower than the rate at which trace data is generated in the debug units. The external device may generate a throttling trigger in order to prioritise transport of the data that that external device considers most important.

Throttling may be instigated at a debug unit by that debug unit itself. Typically this would occur in response to the state of the internal trace buffer 336. If the internal trace buffer is reaching capacity, the debug unit changes the configuration of its filters 310 to reduce the rate at which trace data is being generated. If the throttling is instigated by the debug unit itself, the throttling only applies to that debug unit.

The debug unit may be configured to override a throttling event received from the shared hub or external device using a throttling condition local to the debug unit. For example, if the throttling event received from the shared hub instructs the debug unit to generate more trace data than the debug unit is able to store in its internal trace buffer 336, then the debug unit may override the instruction from the shared hub in order to implement its own throttling condition which reduces the amount of trace data being generated to an amount that the internal trace buffer is able to store.

Preferably, if the throttling is instigated either by the shared hub or an external device, the throttling is sent to every debug unit in the architecture. However, the shared hub or external device may select a subset of the debug units to receive the throttle.

The same throttle level may be received by a plurality of debug units, but be interpreted differently by the different debug units. Table 1 below illustrates an example of this.

TABLE 1

| Debug Unit | Throttle level 1 | Throttle level 2 | Throttle level 3 |
| --- | --- | --- | --- |
| 1 | trace | trace | trace |
| 2 | trace | trace | no trace |
| 3 | trace | no trace | no trace |

On receiving throttle level 1, all three debug units trace their connected peripheral circuits. However on receiving throttle level 2, debug units 1 and 2 trace whereas debug unit 3 does not trace. On receiving throttle level 3, debug unit 1 traces, whereas debug units 2 and 3 do not trace.

The same throttle level may be interpreted by a debug unit to mean different actions should be taken in respect of different conditions that the debug unit is looking for in the output of the connected peripheral circuit. Table 2 below illustrates an example of this.

TABLE 2

| Debug Condition | Throttle level 1 | Throttle level 2 | Throttle level 3 |
| --- | --- | --- | --- |
| X | trace | trace | no trace |
| Y | trace | no trace | no trace |

As an example, X may be data in the range 0-200 and Y may be data in the range 500-1000. On receiving throttle level 1, the debug unit traces both of the data ranges X and Y. On receiving throttle level 2, the debug unit only traces the data range X. And on receiving throttle level 3, the debug unit does not trace either of the data ranges.

Alternatively, a plurality of throttle levels may be received by a debug unit, each throttle level in respect of a different type of debug data. The debug unit implements each throttle level in respect of its associated debug data type concurrently. Suitably, the shared hub is configured to store the data output from the debug units in accordance with one throttle level in preference to the data output from the debug units in accordance with another throttle level.

Suitably, an event message received by a debug unit comprising a throttle level also includes an indication of the flow that the throttled data is to be output onto.

Communication Interface

Some data transfers are more time-critical than other data transfers. For example event data is time-critical. Usually control data (also known as configuration data) is not time-critical. Usually control data is integrity-critical, i.e. it is important that it is successfully received at the destination unit, but it is not important that the data is received as quickly as possible at the destination unit. Usually debug data is neither time-critical nor integrity-critical.

It is known to use different buses on a SoC to transport event data and configuration data. Since event data has its own bus, it can be guaranteed that any event data will be transported as soon as it is ready for sending. The debug architecture described above has only one single physical interface between each pair of components in the architecture. In other words there is only one single physical interface between the shared hub and a debug unit. There is only one single physical interface between the shared hub and a communication adapter. Each interface is configured to transport any data, whether that data comprises control (configuration) data, event data or debug data. Since there is only one interface between two components for transporting control data, event data and debug data, that interface may be in the process of sending control data or debug data when an event happens, thereby preventing the time-critical event data from being sent.

As described above, preferably the components of the debug architecture communicate using messages. Typically, a change of configuration or debug data is communicated using a plurality of messages, whereas an event is communicated using one message. Each interface between a shared hub and a debug unit, a shared hub and another shared hub, or a shared hub and a communication adapter is configured such that if an event occurs whilst the interface is transporting configuration data or debug data, the interface interrupts the transport of the configuration data or debug data in order to transport the event data. The event data is then transported, following which the remaining configuration data or debug data is transported. The interface is configured to prioritise transport of the event data over transport of configuration data and debug data.

The following describes an exemplary message interface signalling protocol suitable for use on the interface between a shared hub and debug unit, a shared hub and another shared hub, or a shared hub and a communication adapter.

Figure 5:
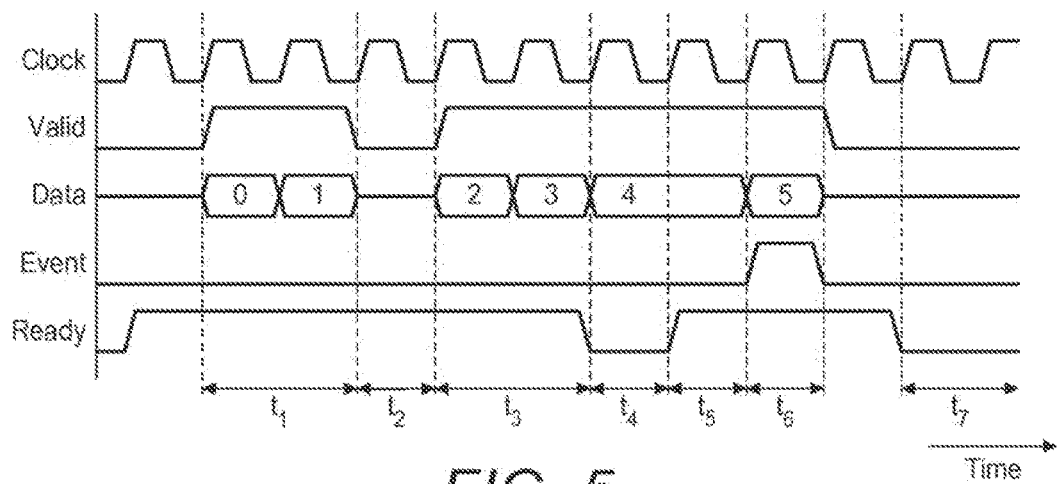
FIG. 5 illustrates the transfer of a set of configuration data messages over an interface.

Each message comprises control bits which represent VALID, EVENT and READY. The values of these control bits (either asserted or not asserted) are illustrated on FIG. 5, along with the DATA bits and the debug CLOCK. The sender asserts VALID when it has data ready to send. The receiver asserts READY when it is ready to receive data. A data message is sent from the sender to the receiver when there is data to send and VALID and READY are both asserted. This is the case, for example, for the transfer of data messages 0 and 1 during time period $t_1$ on FIG. 5. During time period $t_2$ the receiver is ready to receive data and hence has asserted READY, but the sender is not ready to send data and hence has deasserted VALID, hence no data is sent. Data messages 2 and 3 are transferred during time period $t_3$. During time period $t_4$, the sender is ready to send data but the receiver is not ready since it has deasserted READY, hence no data is sent. The receiver reasserts READY during time period $t_5$, at which point data message 4 is transferred. The sender asserts EVENT during time period $t_6$ to indicate that it is sending the last data message, message 5, of the data set to complete the transfer. After the end of the transfer, the receiver is still ready to receive data and hence continues asserting READY until it becomes idle during time period $t_7$.

Figure 6:
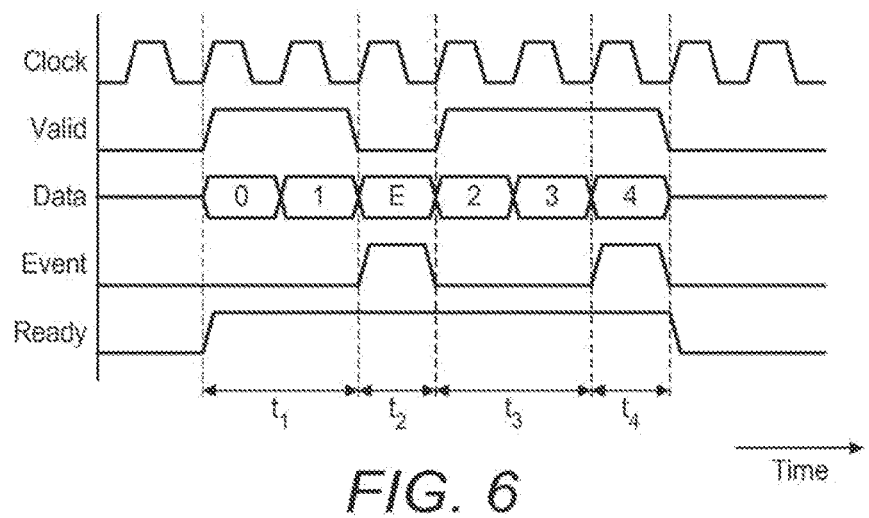
FIG. 6 illustrates the transfer of a set of configuration data messages and an event message over an interface.

FIG. 6 illustrates the situation when an event happens whilst an interface is transmitting a set of five configuration messages. During time period $t_1$, the sender is ready to send data as indicated by the assertion of VALID, and the receiver is ready to receive data as indicated by the assertion of READY, and hence data messages 0 and 1 are sent. Then an event happens. The sender sends the event data to the receiver in the next data message E during time period $t_2$. The sender signals to the receiver that the data in the message is an event by deasserting VALID and by asserting EVENT. The event is a single clock cycle message. Following transmittal of the event, the sender reasserts VALID, deasserts EVENT and continues transmitting the configuration data in data messages 2 and 3 during time period $t_3$. Data message 4 sent during time period $t_4$ is the final message of the configuration data message set, and hence the sender asserts EVENT in message 4 to indicate this to the receiver.

If the sender is idle when the event occurs, it reacts in the same way by asserting EVENT and deasserting VALID in the event message. The receiver interprets any message in which EVENT is asserted and VALID deasserted as being an event message.

An event message may be generated by the shared hub, a debug unit or a communication unit. An event message is generated as a result of an event occurring at the entity that generated the event message. Examples of events include the expiry of a timer, the detection of a specific value in the output from a peripheral circuit, and a manual trigger. An event which is generated by a debug unit is routed by the shared hub to one or more other debug units. Alternatively, an event generated by a debug unit is routed by the shared hub to one or more communication units. A communication unit is a term used to describe a unit comprising a communication adapter and a communication interface.

The set of configuration data messages may be being sent from the shared hub to a debug unit when an event occurs at the debug unit. The interface interrupts the transmittal of the configuration data in order to transmit an event message from the debug unit to the shared hub. Alternatively, the set of configuration data messages may be being sent from the shared hub to a debug unit when an event occurs at the shared hub. The interface interrupts the transmittal of the configuration data in order to transmit an event message from the shared hub to the debug unit.

The payload of an event message indicates what action the unit receiving the event message should take in response to receiving that event message. For example, an event message may instruct a debug unit to change its mode. The debug unit may change its mode to one that implements any one or combination of the following operations: initiates tracing of the connected peripheral circuit, stops tracing the connected peripheral circuit, disables all operations of the debug unit, enables operations of the debug unit, resets the debug unit, adjusts the filters set in the debug unit for debugging the connected peripheral circuit, resets the timer of the debug unit, restarts the timer of the debug unit, resynchronises the timer of the debug unit, sends the debug unit's current time to the shared hub, sets a throttle level in the debug unit, deactivates a throttle level in the debug unit, sets a new trigger in the debug unit, deactivates a trigger in the debug unit, releases buffered data, flushes the trace buffer, reports when the debug unit reaches a state defined by the event data, or instantaneously samples the data output from the connected peripheral circuit on reaching the state defined by the event data.

As a further example, the event message may instruct the debug unit to change the mode of the peripheral circuit connected to the debug unit. For example, the event message may instruct the debug unit to start the operation of the peripheral circuit, or stop the operation of the peripheral circuit. If the peripheral circuit is a processor, the event message may instruct the debug unit to step the processor.

Distributed Event Driven Data Capture

As SoC technology develops, more and more core devices are being embedded onto the integrated circuit chip. These core devices are connected by increasingly complex interfaces, often called interconnects. These interconnects convey data between the various core devices. The interconnects are not generally point-to-point links but more complex structures with intermediate points such as several layers of switches, routing and buffers. Debugging by tapping into an interconnect is a difficult task because the transactions between individual cores are obscured by the quantity of data being transferred and the complexity of the manner in which that data is being transferred. An attempt to trace all the intermediate points of a complex interconnect would lead to the generation of more trace data than is travelling over the interconnect itself. The limited bandwidth available to transfer data on-chip is not sufficient to transfer all of this trace data. Additionally, the rate at which data is output from the chip, for example to off-chip debuggers, is slow compared to the rate at which data is transferred on-chip. Hence, even if all the trace data could be transferred on-chip to the chip boundary, it would be undesirably slow to transfer all that trace data to an off-chip debugger.

The debug architecture described with reference to FIGS. 1 to 3 implements a system of distributed capture of debug information. Each peripheral circuit has connected to it a debug unit for generating debug information of that peripheral circuit. When an event occurs in the debug architecture, an event message is generated. This event message is distributed to other debug units in the architecture and causes them to respond. The debug units may respond by either changing their mode of operation or changing the mode of operation of their attached peripheral circuits. Examples of mode changes are given above in the section entitled Communication Interface. For example, the event message may cause a debug unit to start tracing its peripheral circuit or to change its filters. Different debug units in the debug architecture receiving the same event message may respond differently, for example by collecting debug data at different resolutions. For example, debug unit 1 might respond to an event message by tracing data in the range 0-1000, whereas debug unit 2 might respond to the same event message by tracing data in the range 400-500.

This mechanism in which an event occurring in one part of the debug architecture causes an event message to be distributed to other debug units in the debug architecture is called cross-triggering. The event may occur at a debug unit, a shared hub or a communication unit. The communication unit may, for example, receive an instruction from an off-chip debugger to generate a chip-wide debug trigger. The event messages are routed through the shared hub to the debug units.

Suitably, an event message causes the debug units to start tracing data from their attached peripheral circuits. By capturing data from across the debug architecture rather than just where the event occurred, it is easier to uncover the cause of the event.

In response to the same or another event message, the debug units stream their collected debug information to a plurality of stores distributed in the debug architecture. The stores have a limited storing capacity, and become full if data is being input to them at a greater rate than it is being output from them. When the stores become full, they continue receiving new data. They rewrite over older data with the new data. As such, the data stored in each store is a continually updated short history of the output of the peripheral circuits. Since, some of the data received by a store is never outputted because it is over-written, the store receives debug information at a higher stream rate than it outputs the debug information. Consequently, the quantity of trace data that is accumulated on-chip is limited by the size of the stores that store that trace data, and those stores are implemented in such a way as to store the most recent, and hence usually most useful, data. Suitably, the stores are circular buffers.

Suitably, the stores are located at the debug units themselves. Suitably, each store which responds to a cross-triggered event message stores the data it generates in its own trace buffer 336 illustrated on FIG. 3. On receiving a further event message, the debug unit then outputs the stored trace data to the shared hub. In the case that the trace data is to be outputted from the chip to an off-chip debugger, the shared hub routes the data onto a communication unit which interfaces with that off-chip debugger. If the trace data of a peripheral circuit is accumulated in the store in the debug unit attached to that peripheral circuit, and is written over as described above so as to maintain a short history of the output of that peripheral circuit, then less data is outputted from the debug unit. If the debug units are configured in this way, then less data is output from the debug units for transfer on the chip which is useful because of the limited bandwidth available for transferring data on the chip.

Alternatively, the stores are located in one or more shared hubs. The arrangement in which more than one shared hub is in the debug architecture is explained in the section entitled Hierarchical Debug Architecture. The stores are preferably implemented by a plurality of logical buffers within the same physical buffer in the shared hub or shared hubs. Preferably, a separate logical buffer is used to store the trace data from each peripheral circuit. By segregating the storing of trace data from different peripheral circuits, a known quantity of data is accumulated for each peripheral circuit individually. Hence a short history of each peripheral circuit individually is available. Preferably, the shared hub at which the trace data from a debug unit is stored, is directly accessible to that debug unit. In other words, the shared hub is the local shared hub of that debug unit in a hierarchical debug architecture. If the stores are configured as described above, then the rate at which data is input to the store is greater than the rate at which data is output from the store, hence the closer that the store is to the debug unit, the less data is transferred on the chip.

Alternatively, the stores are located in one or more dedicated memories on the integrated circuit chip but external to the debug units and shared hubs. Preferably, a separate buffer is used to store the trace data from each peripheral circuit. By segregating the storing of trace data from different peripheral circuits, a known quantity of data is accumulated for each peripheral circuit individually. Hence a short history of each peripheral circuit individually is available.

The plurality of stores may be any combination of buffers in the debug units, shared hub or shared hubs and dedicated memories.

Suitably, a further event message is distributed to the debug units to cause them to stop generating debug data. In response to receiving this event message, the debug units stop tracing their attached peripheral circuits. Another event message may be distributed to the debug units to cause them to flush their buffers. In response to receiving this event message, the debug units flush their buffers. For example, an event occurring at a first debug unit which is connected to a first peripheral circuit can cause a second debug unit which is connected to a second peripheral circuit to flush its buffer, wherein the first and second peripheral circuits are different devices on the same chip.

The event messages may be distributed to all the debug units in the debug architecture. Alternatively, the event messages may be selectively distributed to only some debug units in the debug architecture.

Hierarchical Debug Architecture

The debug architecture is suitably hierarchical. A hierarchical debug architecture is illustrated on FIG. 7. Three hierarchical levels are illustrated in this example: levels 1, 2 and 3 as marked on the diagram.

The subsystem of a shared hub connected to an access controller and a plurality of debug units which are connected to respective peripheral circuits exists over two levels of the hierarchy. For example, shared hub 710 and access controller 712 are at level 2 of the hierarchy of FIG. 7. Peripheral circuits 732, 736 and 740 and their respective debug units 730, 734 and 738 which are connected to shared hub 710 are at level 3 of the hierarchy of FIG. 7.

Figure 7:
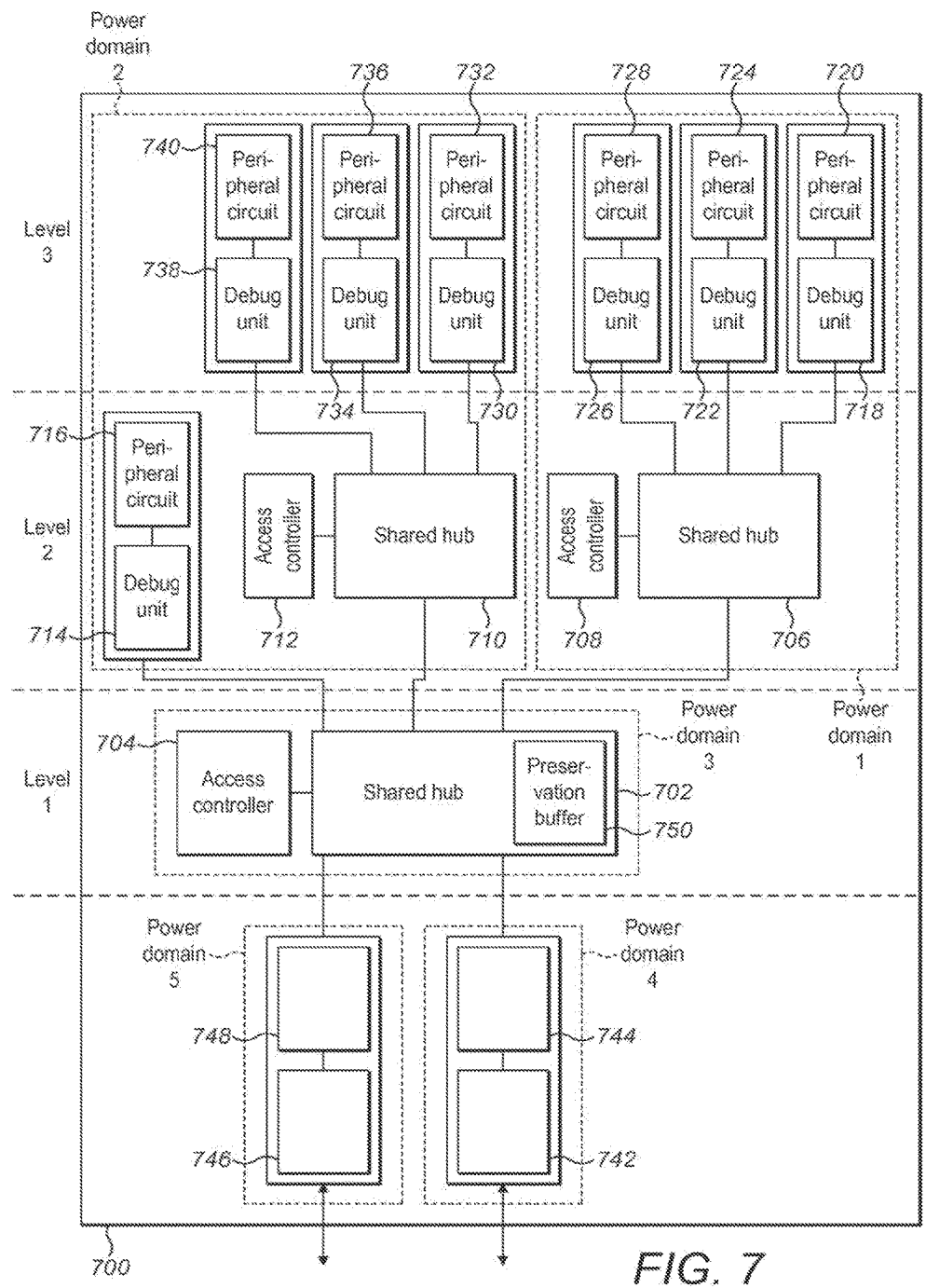
FIG. 7 is a schematic diagram of an exemplary hierarchical debug architecture.

The subsystem of a shared hub and access controller connected to one or more peripheral circuits through respective debug units is one that is repeated in different hierarchical levels of a hierarchical debug architecture, as illustrated on FIG. 7. When such a subsystem is located in the second level of the hierarchy, the shared hub at the first level of the hierarchy is connected to the shared hub of that subsystem in the second level of the hierarchy. For example, in FIG. 7 shared hub 702 in level 1 of the hierarchy is connected to shared hubs 706 and 710 in level 2 of the hierarchy. This means that the shared hub at the lowest level of the hierarchy is directly connected to at least one further shared hub in the hierarchy.

The hierarchical debug architecture is highly modular. It is desirable to reuse sections of the architecture, for example to transplant identical hardware for a shared hub and its connected debug units to a different hierarchical level. However, if two identical units are located in the same SoC, they will both have the same address. This is not compatible with current addressing mechanisms in which every unit has a unique address.

The following describes an addressing mechanism which enables each unit in a system to consider itself to have the same address, which is referred to in the following as the base address. Each unit through which a message is routed on its path to a destination unit re-indexes the destination address of that message in the described addressing mechanism.

Figure 8:
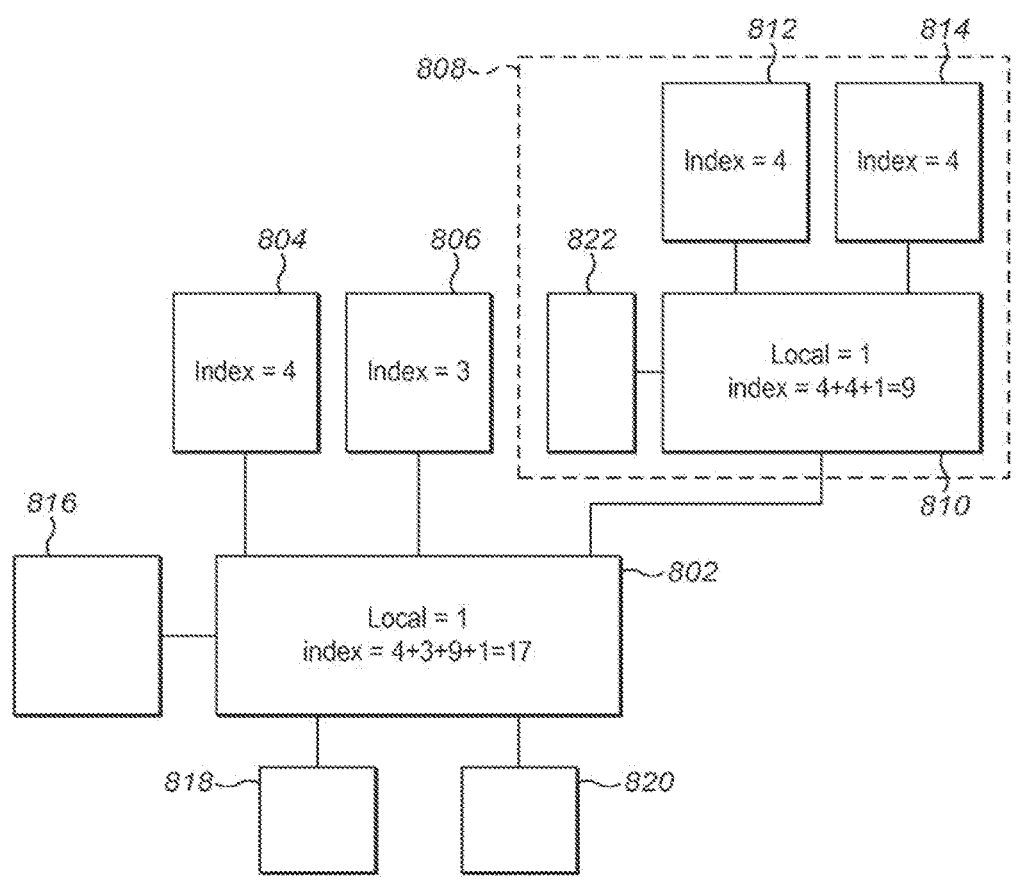
FIG. 8 illustrates exemplary address indices of units in a hierarchical debug architecture.

FIG. 8 illustrates a less complex hierarchical architecture. Shared hub 802 is connected to two peripheral units (where a peripheral unit is the combination of a peripheral circuit and a debug unit) 804 and 806, subsystem 808, access controller 816 and two communication units 818 and 820. Subsystem 808 comprises shared hub 810 connected to two peripheral units 812 and 814 and access controller 822.

Consider the case where peripheral unit 814 wants to send a message to peripheral unit 806. Peripheral unit 814 sends the message to shared hub 810. Shared hub 810 routes the message to shared hub 802. Shared hub 802 routes the message to peripheral unit 806.

Each unit in the hierarchy has one or more address indices. For example, if all the messages that a unit receives are internally received by the same subunit, then that unit suitably has one address index. If however, the messages that a unit receives are routed to different locations internally or to different units, then that unit suitably has more than one address index to facilitate that routing. In the example of FIG. 8, peripheral units 812, 814 and 804 all have 4 address indices, and peripheral unit 806 has 3 address indices. Shared hub 810 has 1 local index. In other words, it has 1 index internal to the shared hub. All messages which are received by that shared hub are internally received by the same subunit. However, because the shared hub routes messages onto peripheral units 812 and 814, the message index of the shared hub is the sum of: (i) the message indices of all the units to which it routes messages higher in the hierarchy; and (ii) its local index. Thus, as illustrated on FIG. 8, the message index of shared hub 810 is 9. The shared hub 802 also has 1 local index. Its message index is the sum of the message indices of the units to which it routes messages higher in the hierarchy and its local index. Thus, as illustrated on FIG. 8, the message index of shared hub 802 is 17.

Consider the case where the base address is Ox10. Peripheral unit 814 has 4 address indices, thus considers itself to have an address which is Ox10-Ox13. According to peripheral unit 814, peripheral unit 812 has an address which is Ox6-Ox9. According to peripheral unit 814, shared hub 810 has an address Ox5. According to peripheral unit 814, destination unit 806 has an address Ox2-Ox5. Thus, peripheral unit 814 includes the destination address Ox2 in the message that it sends to shared hub 810 to be routed to peripheral unit 806. Shared hub 810 receives the message. From the viewpoint of shared hub 810, shared hub 810 has address Ox10, peripheral unit 812 has address Ox11-Ox14, peripheral unit 814 has address Ox15-Ox18, and peripheral unit 806 has address Ox7-Ox9. Shared hub 810 rebases the destination address of the message such that it is the address of peripheral unit 806 from the viewpoint of the shared hub 810. So, in this example, shared hub 810 rebases the destination address such that it is Ox7.

The shared hub rebases the destination address by adding an offset to the destination address in the message that the shared hub received. This offset depends on whether the shared hub has received the message from a source unit which is above it in the hierarchy or below it in the hierarchy. In this case, the source unit is peripheral unit 814 which is above the shared hub 810 in the hierarchy. The shared hub determines the offset to apply to the destination address in the message it has received to be b+n. b is the number of address indices occupied by the shared hub, i.e. the local index of the shared hub. In this case b=1. n is the number of address indices occupied by the units which are in the same hierarchical level as the source unit from which the shared hub received the message, but which have smaller addresses than the source unit. In this case n=4. Thus, the offset is determined to be 1+4=5. The destination address is thus rebased to Ox2+Ox5=Ox7.

The shared hub 810 then routes the message onto the next unit in the path of the message to its destination unit, which is shared hub 802. From the view point of shared hub 802, shared hub 802 has address Ox10, and destination unit 806 has address Ox15-Ox17. Shared hub 802 rebases the destination address of the message such that it is the address of peripheral unit 806 from the viewpoint of the shared hub 802. So, in this example, shared hub 802 rebases the destination address such that it is Ox15.

From the viewpoint of shared hub 802 the source unit is shared hub 810, because that is the unit that sent the message to shared hub 802. The source unit is above the shared hub 802 in the hierarchy. Thus, shared hub 802 determines the offset to apply to the destination address in the message it has received to be b+n, which are determined in the same way as described above with reference to the shared hub 810. The local index of the shared hub 802 is 1, hence b=1. The number of address indices occupied by the units which are in the same hierarchical level as the source unit 810 from which the shared hub 802 received the message, but which have smaller addresses than the source unit are 7. This includes the 4 indices of peripheral unit 804 and the 3 indices of peripheral unit 806. Thus, n=7. Thus, the offset b+n=8. The destination address is thus rebased to Ox7+Ox8=Ox15.

The shared hub 802 then routes the message onto the destination unit 806. From the view point of peripheral unit 806, peripheral unit 806 has address Ox10-Ox12, and shared hub 802 has address Ox5. The peripheral unit 806 rebases the destination address of the message such that it is its own address from its own viewpoint, i.e. Ox10.

The peripheral unit rebases the destination address by adding an offset to the destination address currently in the message. In this case, the peripheral unit received the message from a source unit (shared hub 802) which is below it in the hierarchy. Because the source unit is below the peripheral unit in the hierarchy, the peripheral unit determines the offset to apply to be −(c+m). c is the number of address indices occupied by the shared hub that routed the message up to the unit that is rebasing the address, i.e. the local index of that shared hub. c=1. m is the number of address indices occupied by the units which are in the same hierarchical level as the unit which is rebasing the address, but which have smaller addresses than the unit which is rebasing the address. In this case m=4. Thus, the offset is determined to be −(1+4)=−5. The destination address is thus rebased to Ox15−Ox5=Ox10. Hence, the peripheral unit determines that the destination of the message is itself.

Now, consider the case where the peripheral unit 806 wants to send a message to peripheral unit 814. Peripheral unit 806 sends the message to shared hub 802. Shared hub 802 routes the message to shared hub 810. Shared hub 810 routes the message to peripheral unit 814.

According to peripheral unit 806, which considers its address to be Ox10-Ox12, the address of the destination unit 814 is Ox18-Ox22. The peripheral unit 806 thus includes the destination address Ox18 in the message.

The shared hub 802 receives the message with destination address Ox18. According to shared hub 802, the address of peripheral unit 814 is Ox23-Ox26. The source unit 806 is above the shared hub 802 in the hierarchy, thus the shared hub 802 determines the offset to apply to the destination address to be b+n as defined above. b is the local index of shared hub 802 which is 1. n is the number of address indices occupied by units in the same hierarchical level as the source unit 806 but having smaller addresses than the source unit. In this case n=4. Thus the offset is determined to be 1+4=5. Hence the destination address is rebased by shared hub 802 to Ox18=Ox5=Ox23.

The shared hub 802 then routes the message onto the next unit in the path of the message to its destination unit, which is shared hub 810. From the view point of shared hub 810, the peripheral unit 814 has address 0x15-0x18.

The shared hub 810 is above the shared hub 802 in the hierarchy, thus the shared hub 810 rebases the destination address in the message by adding the offset $-(c+m)$, where c and m are as previously defined. c is the number of address indices occupied by the shared hub 802 which routed the message up to the shared hub 810. c=1. m is the number of address indices occupied by the units which are in the same hierarchical level as the shared hub 810, connected to the same shared hub 802, but which have smaller addresses than shared hub 810, i.e. the number of indices occupied by peripheral units 804 and 806. Thus, m=4+3=7. Thus, the offset is determined to be $-(1+7)=-8$. The destination address is thus rebased to 0x23−0x8=0x15.

The shared hub 810 then routes the message onto the next unit in the path of the message to its destination unit, which is peripheral unit 814. This is the destination unit, and hence peripheral unit 814 considers both its own address and that of the destination to be 0x10.

The peripheral unit 814 is above the shared hub 810 in the hierarchy, thus the peripheral unit 814 rebases the destination address in the message by adding the offset $-(c+m)$. Shared hub 810 has a local index of 1, hence c=1. Peripheral unit 812 has 4 address indices, hence m=4. Thus, the offset is determined to be $-(1+4)=-5$. The destination address is thus rebased to 0x15−0x5=0x10. Hence, the peripheral unit 814 determines that the destination of the message is itself.

Suitably, if a message is being routed up the hierarchy, and a unit receives a message which, after rebasing, has a destination address which is smaller than the base address, the unit discards the message. Similarly, suitably, if a message is routed up the hierarchy, and a unit receives a message which, after rebasing, has a destination address which is larger than the address of any unit which is accessible by that unit in a higher hierarchical level, then the unit discards the message.

Preferably, a message includes the destination address and an indication of the direction of the message, i.e. whether it is being sent up the hierarchy or down the hierarchy.

Prior to any messages being sent in the hierarchical system, each unit preferably sends the total number of address indices allocated to it and any units in higher hierarchical levels to which that unit is accessible down to the shared hub in the next level down of the hierarchical level to which the unit is directly accessible.

The described rebasing addressing mechanism allows each unit in the debug architecture to consider itself to have the same address. Thus, this addressing mechanism is compatible with a modular debug architecture comprised of identical structures with identical internal addresses.

Power Down

Typically, SoCs incorporate functionality to power up and power down all or part of the chip. It is common for the chip to have several power domains that can be independently powered up and down. The statuses of the power domains on the chip are typically determined and implemented separately from decisions regarding debugging. Hence, a power domain may be powered down whilst the peripheral circuits in that domain are being debugged. Powering down a portion of an integrated circuit chip causes the peripheral circuits in that portion of the chip and the debug units connected to those peripheral circuits to be powered down. When the power is restored, it is desirable for the debugging session to resume. However, typically, on powering down a debug unit, its configuration information is lost. Configuration information comprises, for example, the state of the filters 310, the state of the interval counter 328, current triggers stored in trigger hub 308, information about which flow messages are to be output on, and information about where messages are to be routed. On powering up the debug unit, it no longer has the configuration information, thus is unable to resume its debugging session.

The debug architecture described herein preferably preserves the configuration of debug units when they are powered down, such that they are able to continue debugging when powered back up. The configuration information is extracted from the debug units prior to power down, stored during power down, and then restored to the debug units on power up prior to operation of the debug units and their connected peripheral circuits being resumed. Thus, on power up, the debug unit has the same configuration it had prior to power down. The debug unit resumes debugging the peripheral circuit in accordance with its configuration. In other words, the debug unit resumes debugging the peripheral circuit in the same manner that it was doing prior to power down. The following describes an exemplary method for implementing this procedure.

Configuration information held in a debug unit which is not retained in the debug unit during power down is copied by the debug unit and sent in configuration messages to a preservation buffer. The preservation buffer is a protected buffer which is not powered down whilst the portion of the circuit is powered down. The preservation buffer may be in a shared hub. For example, the preservation buffer may be all or part of the same buffer that is used in the shared hub to store trace data from the debug units. Alternatively, the preservation buffer may be in a dedicated memory. If several debug units are being powered down, then suitably each debug unit sends its configuration information to the same preservation buffer. This is more space efficient that storing the configuration information in separate preservation buffers. There may be several power domains on the integrated circuit chip, more than one of which is powered down at the same time. The extent to which the different power domains are powered down may be different, and the duration of their power downs may be different. Thus, suitably, the preservation buffer is divided into regions, each region for storing configuration information for debug units from a respective one of the power domains. The preservation buffer is configured to distinguish the configuration messages from debug units in different power domains, and store the configuration information from a debug unit in the designated region of the buffer for the power domain of that debug unit. The preservation buffer is also configured to retrieve the configuration information for debug units in a particular domain by accessing the region of the buffer for that power domain.

Each debug unit sends its configuration messages to its local shared hub to which that debug unit is directly accessible. The local shared hub routes the configuration messages on to the preservation buffer. In the case that the preservation buffer is located in a shared hub, it may be in the local shared hub. The preservation buffer may, however, be located in a different shared hub. For example, in a hierarchical debug architecture, the shared hub which is local to the debug unit may also be powered down along with the debug unit. For example, in FIG. 7, power domain 1 may be powered down. Debug units 718, 722 and 726 all send their configuration information to their local shared hub 706. However, shared hub 706 is also being powered down because it is in power domain 1. In this case, the local shared hub 706 routes the configuration information of debug units 718, 722 and 726 to the next shared hub in the next level down in the hierarchy to which the local shared hub is directly accessible, in this case shared hub 702. Suitably, the local shared hub 706 also routes its own configuration information down to the next shared hub 702. If the preservation buffer is in this next shared hub, as it is in FIG. 7, then the configuration information is stored there. As shown in FIG. 7, the preservation buffer 750 is in shared hub 702 which, along with access controller 704, form a separate power domain, power domain 3. Suitably, power domain 3 remains powered up when any combination of power domains 1, 2, 4 and 5 are powered down. If however, the shared hub to which the local shared hub routed the configuration information is also to be powered down, then it too routes the configuration information it has received to a shared hub in the next level down in the hierarchy to which it is directly accessible. Suitably, it also routes its own configuration information down to the shared hub in the next level of the hierarchy. The process continues until the configuration information reaches the shared hub in which the preservation buffer is located or the alternative memory location in which the preservation buffer is located. The configuration information is then stored in the preservation buffer.

On power up, the preservation buffer extracts the stored configuration information for each debug unit in the power domain that is being powered up, and sends the configuration information for each debug unit to that debug unit. The preservation buffer also extracts stored configuration information for any shared hubs that were powered down in the power domain, and sends the configuration information for each shared hub to that shared hub. The configuration information is routed back up the hierarchy to the unit to which that configuration information is to be restored.

In a hierarchical architecture, suitably each shared hub determines the number of structures accessible to that shared hub in higher layers of the hierarchy which have configuration information to be extracted and preserved prior to power down. For example, in FIG. 7, shared hub 706 would determine that there are three structures in higher layers of the hierarchy which fit this description: debug units 718, 722 and 726. The shared hub then adds the number of determined structures to the number of structures in the shared hub itself which have configuration to be extracted and preserved prior to power down to form an accumulated number. For example, if shared hub 706 determines that it has one structure from which configuration is to be preserved during power down, then it forms an accumulated number of four. The shared hub routes its accumulated number to a shared hub in the next layer down in the hierarchy to which it is directly accessible. In the example of FIG. 7, shared hub 706 routes the accumulated number to shared hub 702.

In a hierarchical architecture, suitably each shared hub also determines the size (for example number of bytes) needed for preserving the configuration of the structures accessible to that shared hub in higher layers of the hierarchy which have configuration information to be extracted and preserved prior to power down. The shared hub adds that determined size to the size of the configuration information to be extracted and preserved from itself to form an accumulated size. The shared hub routes this accumulated size to a shared hub in the next layer down in the hierarchy to which it is directly accessible.

The shared hub or dedicated memory which comprises the preservation buffer uses the accumulated number and/or the accumulated size to configure a sufficient sized buffer and control circuitry to receive, store and return the configuration information. Suitably, the control circuitry comprises a table to store the start of the configuration region and a tail pointer that is advanced as the region is filled.

Suitably, a debug unit sends its configuration information to the preservation buffer in an extraction message set which comprises one or more messages. The preservation buffer sends the configuration information back to the debug unit on power up in a restoration message set which comprises one or more messages. The extraction message set is the same as the restoration message set. Suitably, the extraction message set is sent to the preservation buffer and then released to a loopback communicator which offers it as an input to the shared hub. The shared hub then sends them to the debug unit as the restoration message set. Since the sequence of the configuration information in the restoration message set is the same as the sequence of the configuration information in the extraction messages set, the debug unit releases the configuration information into its output buffer 344 in the order that that information is to be restored when power is restored.

Prior to sending the extraction message set to the preservation buffer, the debug unit suitably purges any buffers which hold data from an active operation. For example, pending message content in output buffer 344 is deleted. The contents of the input message buffer 314 of the debug unit are also deleted. Suitably, the debug unit then instructs the preservation buffer to initialise itself to receive configuration information from the debug unit. The debug unit then extracts its configuration information and sends it in the extraction message set to the preservation buffer.

Suitably, a handshake procedure is implemented at both power down and power up between a power controller and the debug unit. Suitably, each handshake procedure comprises a request message and an acknowledge message. Prior to power down, the power controller sends a power down handshake request message to the debug unit or debug units in the power domain that is being powered down. The debug unit then preserves its configuration information as described above. After the configuration information of the debug unit has been sent to the preservation buffer, the debug unit sends a power down handshake acknowledge message back to the power controller. The power controller then powers down the power domain. To power up the power domain, the power controller sends a power up handshake request to the debug unit. The debug unit then restores its configuration information as described above. The debug unit then sends a power up handshake acknowledge back to the power controller. The power controller then powers up the power domain. This procedure gives the debug unit time to preserve its configuration information prior to power down and to restore its configuration information prior to its connected peripheral circuit resuming normal operation again.

Suitably, a flow is reserved for preserving configuration when a unit is powered-down. In other words a flow is reserved for transferring extraction message sets and restoration message sets.

Debug units may be configured to operate in a virtual power-down mode. In this mode, the debug unit goes through the process described above when it is notified that the portion of the integrated circuit that it is located in is to be powered down, except that it does not power off. It operates in a virtual power-down mode in which it is still on and hence retains its configuration information.

Layered Security

For security, it is useful for access to a debug architecture on chip by an entity external to the chip to be restricted. It is known to apply an authentication exchange between a communication interface at the boundary of the chip and an off-chip debug controller. For example, a correct passcode is required in order to gain access onto the chip through a JTAG port. Once the correct passcode has been provided, the user is allowed access to the whole debug architecture on chip.

Security concerns generally lead manufacturers to fuse the links between any on chip debug hardware and the remainder of the chip after testing during manufacture and prior to releasing the chip onto the market.

Figure 9:
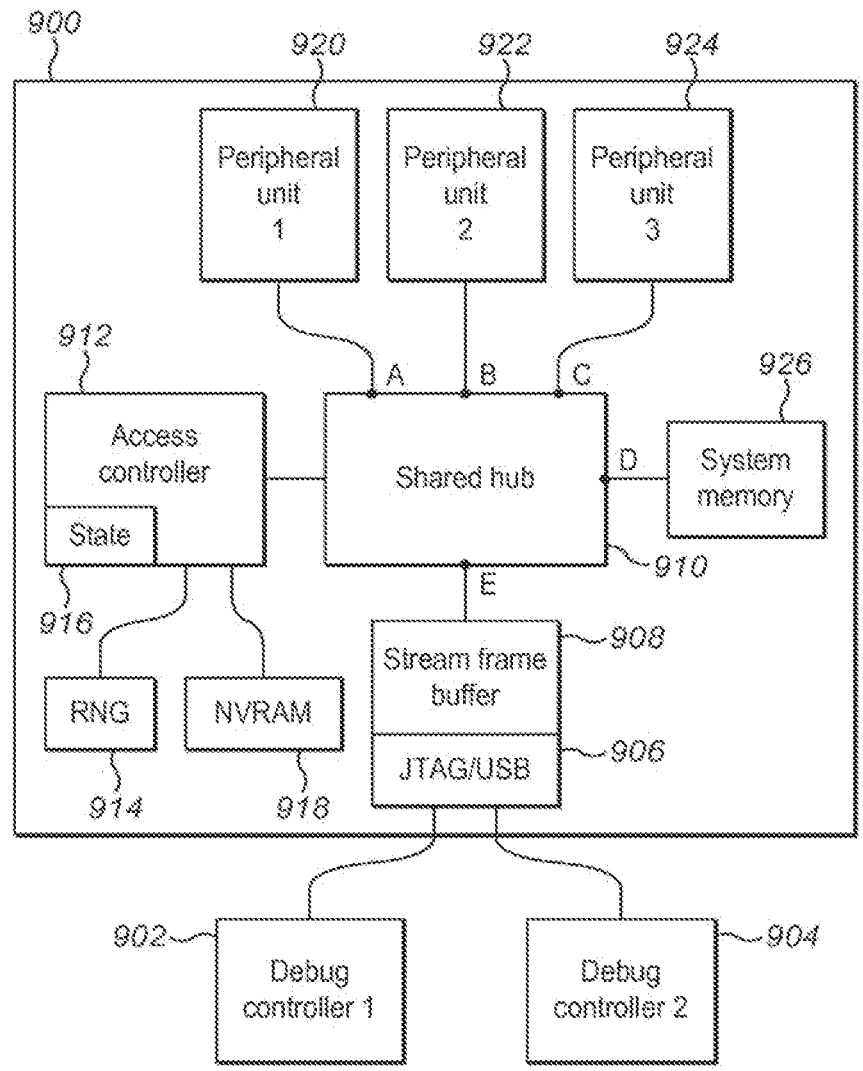
FIG. 9 is a schematic diagram of an exemplary debug architecture comprising security locks.

FIG. 9 illustrates an exemplary layered security system which implements different sets of access rights. SoC 900 is debugged by two off-chip debug controllers, debug controller 1 902 and debug controller 2 904. The debug controllers communicate with the shared hub 910 via a communication unit 906, such as a JTAG or USB port as illustrated, and a stream frame buffer 908.

Prior to a debug controller communicating with the debug architecture on chip, the debug architecture on chip is in a lock down mode. This means that no communications from the debug controller, other than authentication communications, will be allowed to pass through to the shared hub from the stream frame buffer 908. This lock is illustrated by the circle marked E between the stream frame buffer and the shared hub.

If the stream frame buffer receives an authentication request communication from a debug controller, it routes the communication onto the shared hub 910, which in turn routes the communication onto access controller 912. An authentication exchange then occurs between the access controller and the debug controller. Suitably, this authentication exchange is a challenge response authentication. For example, the access controller and the debug controller may exchange keys. The key exchange could be symmetric. The key exchange could be symmetric. For such a key exchange, the access controller suitably generates random numbers in random number generator 914.

If the authentication process is successful, then the debug controller is assigned a set of access rights. The set of access rights allows the debug controller partial access to the debug architecture. For example, the set of access rights may allow access to peripheral units 1 (920) and 2 (922) but not peripheral unit 3 (924) or the system memory 926. The set of access rights may allow no access to the debug architecture. Conversely, the set of access rights may allow complete access to the debug architecture. The access controller loads the set of access rights into its state 916. The set of access rights may be selected by the access controller from a set of predetermined access rights. These predetermined sets of access rights may be stored in memory 918. The access controller may select the set of access rights from those stored in the memory in dependence on the information exchanged during authentication. The access controller then loads the set of access rights into its state 916 from the memory 918.

The access controller instructs the debug architecture to implement the set of access rights. For example, the access controller may send a message to the shared hub to implement locks on pathways emanating from the shared hub. For example, FIG. 9 illustrates locks on the pathways leading from the shared hub to peripheral units 1 (marked A), 2 (marked B) and 3 (marked C) and the system memory (marked D). These locks can be asserted or deasserted. An asserted lock restricts the passage of some messages along the pathway. For example, an asserted lock may prevent all messages passing from the debug controller along that pathway. This is the highest restricted access for a pathway. As another example, an asserted lock may prevent only control messages which are to control the action of a peripheral circuit passing from the debug controller along that pathway. In the case of the system memory, an asserted lock between the shared hub and the system memory may (i) prevent the debug controller accessing the system memory, (ii) allow the debug controller to read from the system memory, but prevent the debug controller from writing to the system memory; or (iii) allow the debug controller to both read from and write to the system memory. Typically, only a debug controller with high security access would be granted access to write to the system memory. If the shared hub receives an instruction to implement a set of access rights from any entity other than the access controller, it does not implement the set of access rights and discards the message.

In a hierarchical debug architecture, the shared hub that receives the instruction from the access controller to implement the set of security rights, passes that instruction through to one or more further shared hubs in the architecture. Suitably, the shared hub only passes the instruction along pathways which are not locked by that instruction. Each of the further shared hubs implements locks on pathways emanating from that shared hub in accordance with the set of access rights. Each of the further shared hubs also passes the instruction to implement the set of security rights through to higher levels of the hierarchy.

Following successful authentication, the access controller 912 informs the debug controller of the successful authentication and of its set of access rights. Following successful authentication, the stream frame buffer routes further communications received from the authenticated debug controller to the shared buffer 910. The debug controller then accesses the debug architecture in accordance with its set of access rights. For example, if the debug controller's set of access rights grant it access to peripheral units 1 and 2, but not peripheral unit 3 or the system memory then locks A, B and E will be deasserted and locks C and D will be asserted. In their asserted states, locks C and D do not allow traffic to flow either from or to the debug controller down their pathways. If the debug controller attempts to access peripheral unit 1, then lock A will allow this access. If the debug controller attempts to access either peripheral unit 3 or the system memory, then locks C and D respectively prevent the access. Furthermore, the message from the debug controller requesting the access is discarded by the shared hub 910.

Suitably, following authentication, an encryption exchange occurs between the debug architecture on chip and the debug controller. Following the encryption exchange, communications between the debug controller and the debug architecture in both directions are encrypted. Suitably, communications between the shared hub and the system memory are also encrypted. This prevents the debug controller from easily being able to access communications that are being routed to or from the system memory via the shared hub.

Suitably, to further increase security, the encryption keys are periodically changed. Preferably, this requires the debug controller to renew the encryption session. To further increase security, the debug controller may be required to periodically re-authenticate with the access controller.

Although in the security system described above the access controller 912 is directly connected to the shared hub 910, this is not necessary. In other implementations, the access controller is located elsewhere on the SoC.

There are several ways of implementing the security system when there is more than one debug controller wanting to access the debug architecture.

For example, the security system could be limited to allowing access by one debug controller at a time. In a first implementation, if a first debug controller has authenticated and is accessing the debug architecture and then a second debug controller attempts to access the system, the access controller assigns no access rights to the second debug controller. Once the first debug controller has finished accessing the debug architecture, then the second debug controller is assigned a set of access rights by the access controller and allowed to access the debug architecture accordingly.

In a second implementation, if a first debug controller has authenticated and is accessing the debug architecture and then a second debug controller attempts to access the system, an authentication exchange occurs between the access controller and the second debug controller. Following successful authentication, the access controller assigns a second set of access rights to the second debug controller. The second debug controller is then allowed to access the debug architecture in accordance with that second set of access rights. The access controller then removes the assigned set of rights to the first debug controller. This results in the first debug controller's debug session being ended by the access controller.

In a third implementation, if a first debug controller has authenticated and is accessing the debug architecture and then a second debug controller attempts to access the system, an authentication exchange occurs between the access controller and the second debug controller. The access controller determines the second set of access rights to assign to the second debug controller. If the second set of access rights grant more access to the debug architecture than the first set of access rights, then the access controller assigns the second set of access rights to the second debug controller and removes the first set of access rights from the first debug controller. The second debug controller is then allowed to access the debug architecture in accordance with the second set of access rights. The first debug controller's debug session is ended by the access controller by the removal of its assigned rights. If, on the other hand, the access controller determines that the second set of access rights grant less access to the debug architecture than the first set of access rights, then the access controller does not assign the second set of access rights to the second debug controller. Once the first debug controller has finished accessing the debug architecture, then the second debug controller is assigned the second set of access rights by the access controller and allowed to access the debug architecture accordingly.

In another example, the security system allows access by more than one debug controller at a time. In a first implementation, if a first debug controller has authenticated and is accessing the debug architecture and then a second debug controller attempts to access the system, the access controller assigns to the second debug controller the same access rights that were assigned to the first debug controller. It may not be necessary for the second debug controller to successfully authenticate with the access controller in order to gain the same access rights as the first debug controller. For example, if both the first and second debug controller are located at the same external source, for example the same PC, then the access controller may consider them to be the same entity and allow equal access. Security measures implemented at the PC may prevent the second debug controller from piggy-backing onto the first debug controller's debugging session in this way.

In a second implementation, if a first debug controller has authenticated and is accessing the debug architecture and then a second debug controller attempts to access the system, an authentication exchange occurs between the access controller and the second debug controller. On successful authentication, the access controller assigns to the second debug controller a second set of access rights to the debug architecture. The second debug controller then accesses the debug architecture in accordance with the second set of access rights concurrently with the first debug controller accessing the debug architecture in accordance with the first set of access rights.

First and second debug controllers may communicate with the debug architecture via the same communication interface as shown on FIG. 9. Alternatively, first and second debug controllers may communicate with the debug architecture via different communication interfaces.

In a hierarchical debug architecture, there are shared hubs in higher layers of the hierarchy than the base layer in which the root shared hub is located. The shared hubs in the higher layers of the hierarchy may have their own attached access controllers, as is shown for example in FIGS. 7 and 8. Alternatively, there may be no access controllers attached to shared hubs in high layers of the hierarchy, the only access controller being the one attached to the root shared hub. In the case that there is one or more access controller in higher layers of the hierarchy in addition to the one attached to the root shared hub, that one or more further access controller may also authenticate and assign access rights to a debug controller or debug controllers as described above with reference to the access controller attached to the root shared hub.

The described security system enables a layered access, i.e. different debuggers are allowed different levels of access to the debug architecture. The described security system is more secure than known systems which only require one passcode to access the entire debug architecture. Hence, it is less likely that a manufacturer would consider it necessary to fuse the links to the debug architecture prior to putting a chip on the market. This would enable on-chip debugging after the chip has been put on the market.

Each component of the debug architecture illustrated in FIGS. 1, 2, 3, 7 and 9 may be implemented in dedicated hardware. Alternatively, each component of the debug architecture illustrated in FIGS. 1, 2, 3, 7 and 9 may be implemented in software. Some components may be implemented in software, whilst other components are implemented in dedicated hardware.

The debug architecture described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. Further software can be provided at the computing-based device to implement the methods described herein. The methods described herein may be performed by software in machine readable form on a tangible storage medium.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A method of powering down a first power domain of an integrated circuit chip having multiple power domains each comprising a plurality of peripheral circuits, each peripheral circuit being connected to a respective debug unit, the method comprising:
prior to power down of the first power domain, extracting from each debug unit in the first power domain configuration information of that debug unit;
prior to power down of the first power domain of the integrated circuit chip, storing the configuration information of the debug units in the first power domain in a memory on the integrated circuit chip, the configuration information of the debug units in the first power domain remaining stored in the memory during power down of the first power domain, the memory divided into regions, each region for storing configuration information for debug units from a respective one of the power domains, and the configuration information of the debug units in the first power domain is stored in the memory region designated for the first power domain; wherein the memory remains powered up during power down of the first power domain of the integrated circuit chip; and
on power up of the first power domain, restoring the configuration information of each debug unit in the first power domain to that debug unit prior to resuming operation of that debug unit and the peripheral circuit connected to that debug unit.

2. A method as claimed in claim 1, wherein for each debug unit in the first power domain, the configuration information is sent from that debug unit in an extraction message set comprising one or more messages and is restored to that debug unit in a restoration message set comprising one or more messages, the extraction message set matching the restoration message set.

3. A method as claimed in claim 2, wherein the configuration information in the extraction message set is ordered such that on receipt of the restoration message set, that debug unit is restored to the configuration it had prior to power down.

4. A method as claimed in claim 1, further comprising prior to extracting from each debug unit in the first power domain configuration information of that debug unit, sending a power down handshake message from a power controller to each debug unit in the first power domain.

5. A method as claimed in claim 4, further comprising, on receipt of the power down handshake message at a debug unit, sending a message from that debug unit to the memory to initialize the memory.

6. A method as claimed in claim 1, further comprising prior to restoring the configuration information of each debug unit in the first power domain, sending a power up handshake message from a power controller to each debug unit in the first power domain.

7. A method as claimed in claim 1, wherein a first shared hub is directly accessible by a first debug unit and a second debug unit in the first power domain, and a second shared hub is directly accessible by the first shared hub, wherein the memory on the integrated circuit chip is located in the second shared hub, comprising:
routing to the first shared hub, extracted configuration information from the first debug unit and extracted configuration information from the second debug unit;
routing to the second shared hub, extracted configuration information from the first shared hub and the extracted configuration information from the first debug unit and the extracted configuration information from the second debug unit; and
storing in the memory located in the second shared hub, the extracted configuration information from the first shared hub, the extracted configuration information from the first debug unit and the extracted configuration information from the second debug unit.

8. A method as claimed in claim 1, wherein the peripheral circuits and debug units of the first power domain form part of a hierarchical debug architecture on the integrated circuit chip, at least one layer of the hierarchical debug architecture comprising at least one shared hub directly accessible by at least one structure on another layer of the hierarchical debug architecture, the method further comprising:
prior to power down of the first power domain, at each shared hub, determining the size of configuration data of structures accessible by that shared hub in higher layers of the hierarchical debug architecture that is to be extracted prior to power down of the first power domain;
adding the size of configuration data of that shared hub to the determined size to form an accumulated size, and routing that accumulated size to a shared hub on a lower layer of the hierarchical debug architecture.

9. A method as claimed in claim 1, wherein power down of the first power domain occurs whilst the integrated circuit chip is being debugged.

10. An integrated circuit chip having multiple power domains, comprising:
a first power domain of the integrated circuit chip comprising a plurality of peripheral circuits, each peripheral circuit connected to a respective debug unit; and
a memory divided into regions, each region designated for storing configuration information of the debug units from a respective one of the power domains, wherein the memory is at a location on the integrated circuit chip such that during power down of the first power domain of the integrated circuit chip the memory remains powered up;
wherein each debug unit from the first power domain is configured to send its configuration information to the designated region of memory for the first power domain prior to powering down the first power domain of the integrated circuit chip;
wherein the memory is configured to store the configuration information of the debug units from the first power domain prior to power down of the first power domain so that the configuration information remains stored in the memory during power down; and
wherein the integrated circuit chip is configured to restore the configuration information of each debug unit from the first power domain to that debug unit on power up of the first power domain prior to resuming operation of that debug unit and the peripheral circuit connected to that debug unit.

11. An integrated circuit chip as claimed in claim 10, wherein each debug unit from the first power domain is configured to:
send configuration information in an extraction message set comprising one or more messages; and
receive the configuration information in a restoration message set comprising one or more messages;
wherein the extraction message set matches the restoration message set.

12. An integrated circuit chip as claimed in claim 10, wherein the memory is integrated in a shared hub, the shared hub being accessible by the debug units from the first power domain.

13. An integrated circuit chip as claimed in claim 10, further comprising a power controller configured to send a power down handshake message to each debug unit from the first power domain prior to extracting configuration information from each debug unit from the first power domain.

14. An integrated circuit chip as claimed in claim 10, further comprising a power controller configured to send a power up handshake message to each debug unit from the first power domain prior to restoring the configuration information of each debug unit from the first power domain.

15. An integrated circuit chip as claimed in claim 10, wherein a first shared hub is directly accessible by a first debug unit and a second debug unit from the first power domain, and a second shared hub is directly accessible by the first shared hub, wherein:
- the first debug unit is configured to route extracted configuration information from that first debug unit to the first shared hub;
- the second debug unit is configured to route extracted configuration information from that second debug unit to the first shared hub;
- the first shared hub is configured to route to the second shared hub, extracted configuration information from the first shared hub and the extracted configuration information from the first debug unit and the extracted configuration information from the second debug unit; and
- the memory on the integrated circuit chip is located in the second shared hub and is configured to store the extracted configuration information from the first shared hub, the extracted configuration information from the first debug unit and the extracted configuration information from the second debug unit.

16. An integrated circuit chip as claimed in claim 10, wherein the peripheral circuits and debug units of the first power domain form part of a hierarchical debug architecture on the integrated circuit chip, at least one layer of the hierarchical debug architecture comprising at least one shared hub directly accessible by at least one structure on another layer of the hierarchical debug architecture, wherein:
- each shared hub is configured to, prior to power down of the first power domain:
    (i) determine the size of configuration data of structures accessible by that shared hub in higher layers of the hierarchical debug architecture that is to be extracted prior to power down of the first power domain;
    (ii) add the size of configuration data of that shared hub to the determined size to form an accumulated size, and
    (iii) route that accumulated size to a shared hub on a lower layer of the hierarchical debug architecture.

* * * * *